United States Patent
Hirai (10) Patent No.: US 7,682,867 B2
(45) Date of Patent: Mar. 23, 2010

(54) ORGANIC THIN-FILM TRANSISTOR AND MANUFACTURING METHOD THEREOF

(75) Inventor: Katsura Hirai, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 265 days.

(21) Appl. No.: 11/811,131

(22) Filed: Jun. 8, 2007

(65) Prior Publication Data

US 2008/0032441 A1     Feb. 7, 2008

Related U.S. Application Data

(62) Division of application No. 10/526,126, filed as application No. PCT/JP03/10990 on Aug. 28, 2003, now abandoned.

(30) Foreign Application Priority Data

Sep. 5, 2002  (JP)  ............................. 2002-259808

(51) Int. Cl.
  *H01L 51/40*   (2006.01)
  *H01L 21/00*   (2006.01)
  *H01L 21/84*   (2006.01)

(52) U.S. Cl. ................. 438/99; 438/151; 257/E21.575; 257/E21.592

(58) Field of Classification Search .................. 438/99, 438/151; 257/421, 40, 422, E21.575, E21.592, 257/E21.596, E21.614

See application file for complete search history.

(56) References Cited

U.S. PATENT DOCUMENTS 6,340,789 B1 * 1/2002 Petritsch et al. .............. 136/263
2004/0026689 A1 * 2/2004 Bernds et al. .................. 257/40

FOREIGN PATENT DOCUMENTS

| JP | 7-304858 A | 11/1995 |
| JP | 9-83040 A | 3/1997 |
| WO | WO 00/36666 A1 | 6/2000 |
| WO | WO 00/79617 A1 | 12/2000 |
| WO | WO 02-15264 A | 2/2002 |

OTHER PUBLICATIONS

Tian-An Chen et al, "Regiocontrolled Synthesis of Poly(3-alkylthiophenes) Mediated by Rieke zinc: Their Characterization and Solid-State Properties", *J. Am. Chem. Soc.*, vol. 117, pp. 233-244 (1995).

Francis Garnier: "Thin Film Transistors Based on Organic Conjugated Semiconductors", *Current Opinion in Solid state and Materials Science*, Aug. 1997, pp. 455-461, vol. 2, XP002354676.

* cited by examiner

*Primary Examiner*—Walter L Lindsay, Jr.
(74) *Attorney, Agent, or Firm*—Frishauf, Holtz, Goodman & Chick, P.C.

(57) ABSTRACT

Disclosed are an organic thin-film transistor and a manufacturing method thereof, the organic thin-film transistor comprising a support and provided thereon, a gate electrode, an insulation layer, a source electrode, a drain electrode, and an organic semiconductor layer, the support comprising at least one of resins, and the organic semiconductor layer containing at least one of organic semiconducting materials, wherein a phase transition temperature of one of the organic semiconducting materials is not more than a glass transition point of one of the resins.

9 Claims, 1 Drawing Sheet

ORGANIC THIN-FILM TRANSISTOR AND MANUFACTURING METHOD THEREOF

This application is a divisional of application Ser. No. 10/526,126 Feb. 28, 2005 now abandoned which is the United States National Phase application of International Application No. PCT/JP03/10990 filed Aug. 28, 2003, which is incorporated herein in its entirety by this reference.

FIELD OF THE INVENTION

The present invention relates to an organic thin-film transistor and a manufacturing method thereof.

BACKGROUND OF THE INVENTION

In recent years, an organic thin-film transistor employing an organic semiconducting compound as a semiconductor channel has been studied. The organic semiconducting compound is easy in processing and high affinity to a plastic sheet support, as compared with an inorganic semiconducting compound, and therefore, is preferred in its application to a thin-film device.

There is, for example, description in Japanese Patent O.P.I. Publication Nos. 9-232589 and 7-206599 that an orientation film increases carrier mobility in an organic semiconductor layer.

Further, there is proposed technique in WO 0079617 that mobility of an organic semiconductor channel is increased by orientation treatment of the semiconductor which employs mesomorphism produced on heating a semiconducting polymer to not less than the a temperature providing liquid phase and an adjoining orientation film.

However, the technique proposed in the patent document requires high temperature of at least 250° C. in order to transit the semiconducting polymer to a liquid phase, and therefore, requires, as a support, colored heat resistant films such as polyimide film or heat resistant materials such as glass plates. Further, this requires a process of forming an orientation film adjacent to the semiconductor layer, which complicates constitution of a semiconductor element.

A modified FET structure has been proposed in Japanese Patent O.P.I. Publication No. 2000-260999, which employs an organic-inorganic hybrid material as a semiconductor channel. Typically, a semiconductor element with high mobility is proposed which employs a self-organizing (self-assemble) semiconductor material, which actually requires complex processes to prepare the semiconductor material.

OBJECT OF THE INVENTION

An object of the invention is to provide an organic thin film transistor with a high mobility of carriers (electrons or holes), which is capable of employing a sheet of conventional plastics or transparent resins as the support, and a manufacturing method thereof.

DISCLOSURE OF THE INVENTION

The object of the invention can be attained according to the following constitutions.

1-1. An organic thin-film transistor comprising a support and provided thereon, a gate electrode, an insulation layer, a source electrode, a drain electrode, and an organic semiconductor layer, the support comprising at least one of resins, and the organic semiconductor layer containing at least one of organic semiconducting materials, wherein a phase transition temperature of one of the organic semiconducting materials is not more than a glass transition point of one of the resins.

1-2. The organic thin-film transistor of item 1-1 above, wherein the organic thin-film transistor is manufactured by a process comprising the step in which heat treating is carried out at a heating temperature between the phase transition temperature and the glass transition point.

1-3. The organic thin-film transistor of item 1-2 above, wherein the heating temperature is in the range of from 100 to 250° C.

1-4. The organic thin-film transistor of item 1-1 above, further comprising an orientation layer provided in contact with the organic semiconductor layer.

1-5. The organic thin-film transistor of item 1-1 above, wherein the phase transition temperature is in the range of from 100 to 240° C.

1-6. The organic thin-film transistor of item 1-1 above, wherein the glass transition temperature is in the range of from 110 to 250° C.

1-7. The organic thin-film transistor of item 1-1 above, wherein the organic thin-film transistor is manufactured by a process comprising the step of coating a solution or dispersion solution of at least one of the organic semiconducting materials on the support to form the organic semiconductor layer.

1-8. The organic thin-film transistor of item 1-1 above, wherein one of the organic semiconducting materials is a π-conjugated polymer or oligomer.

1-9. The organic thin-film transistor of item 1-8 above, wherein the π-conjugated polymer is a homopolymer or copolymer of thiophene and the π-conjugated oligomer is a homo-oligomer or co-oligomer of thiophene.

1-10. The organic thin-film transistor of item 1-9 above, wherein the homopolymer or copolymer of thiophene is a homopolymer or copolymer containing a unit with two or more 3-alkylthiophene rings regioregularly connected in series, and the homo-oligomer or co-oligomer of thiophene is a homo-oligomer or co-oligomer containing a unit with two or more 3-alkylthiophene rings regioregularly connected in series.

1-11. The organic thin-film transistor of item 1-10 above, wherein the alkyl group of the 3-alkylthiophene rings is an alkyl group having a carbon atom number of from 4 to 15.

1-12. A manufacturing process of an organic thin-film transistor comprising a support and provided thereon, a gate electrode, an insulation layer, a source electrode, a drain electrode, and an organic semiconductor layer, the support comprising at least one of resins, and the organic semiconductor layer containing at least one of organic semiconducting materials, wherein a phase transition temperature of one of the organic semiconducting materials is not more than a glass transition point of one of the resins, the process comprising the steps of providing a solution or dispersion solution of the organic semiconducting material, and coating the solution or dispersion solution on the support or on the insulation layer to form the organic semiconductor layer.

1-13. The manufacturing process of item 1-12 above, comprising the step of heat treating the organic semiconductor layer at a heating temperature between the phase transition temperature and the glass transition point.

1-14. The manufacturing process of item 1-13 above, wherein the heating temperature is in the range of from 100 to 250° C.

1-15. The manufacturing process of item 1-13 above, wherein the phase transition temperature is in the range of from 100 to 240° C.

1-16. The manufacturing process of item 1-13 above, wherein the glass transition temperature is in the range of from 110 to 250° C.

1-17. The manufacturing process of item 1-12 above, wherein one of the organic semiconducting materials is a π-conjugated polymer or oligomer.

1-18. The manufacturing process of item 1-17 above, wherein the π-conjugated polymer is a homopolymer or copolymer of thiophene and the π-conjugated oligomer is a homo-oligomer or co-oligomer of thiophene.

1-19. The manufacturing process of item 1-18 above, wherein the homopolymer or copolymer of thiophene is a homopolymer or copolymer containing a unit with two or more 3-alkylthiophene rings regioregularly connected in series, and the homo-oligomer or co-oligomer of thiophene is a homo-oligomer or co-oligomer containing a unit with two or more 3-alkylthiophene rings regioregularly connected in series.

1-20. The manufacturing process of item 1-19 above, wherein the alkyl group of the 3-alkylthiophene rings is an alkyl group having a carbon atom number of from 4 to 15.

2-1. An organic thin-film transistor comprising a support and provided thereon, a gate electrode, an insulation layer, a source electrode, a drain electrode, and an organic semiconductor layer, the support comprising at least one of resins, and the organic semiconductor layer containing at least one of organic semiconducting materials, wherein a phase transition temperature of at least one of the organic semiconducting materials is not more than a glass transition point of at least one of the resins.

2-2. The organic thin-film transistor of item 2-1 above, wherein the organic thin-film transistor is manufactured by a process comprising the step in which heat treating is carried out at a temperature A between the phase transition temperature and the glass transition point.

2-3. The organic thin-film transistor of item 2-2 above, wherein the temperature A is in the range of from 100 to 250° C.

2-4. The organic thin-film transistor of any one of items 2-1 through 2-3 above, further comprising an orientation layer provided in contact with the organic semiconductor layer.

2-5. The organic thin-film transistor of any one of items 2-1 through 2-4 above, wherein the phase transition temperature of at least one of the organic semiconducting materials is not more than 240° C.

2-6. The organic thin-film transistor of any one of items 2-1 through 2-5 above, wherein the glass transition temperature of at least one of the resins is not less than 110° C.

2-7. The organic thin-film transistor of any one of items 2-1 through 2-6 above, wherein the organic thin-film transistor is manufactured by a process comprising the step of coating a solution or dispersion solution of at least one of organic semiconducting materials on the support to form the organic semiconductor layer.

2-8. The organic thin-film transistor of any one of items 2-1 through 2-7 above, wherein at least one of the organic semiconducting materials is a π-conjugated polymer or oligomer.

2-9. The organic thin-film transistor of item 2-8 above, wherein polythiophene is used as the π-conjugated polymer or oligomer.

2-10. The organic thin-film transistor of item 2-9 above, wherein the polythiophene is poly(3-alkylthiophene) having a regioregular structure.

2-11. The organic thin-film transistor of item 2-10 above, wherein the alkyl group of the poly(3-alkylthiophene) having a regioregular structure is an alkyl group having a carbon atom number of from 4 to 15.

2-12. A manufacturing process of the organic thin-film transistor of any one of item 2-1 through 2-11 above, the process comprising the steps of providing a solution or dispersion solution of at least one of the organic semiconducting materials, and coating the resulting solution or dispersion solution on the support to form the organic semiconductor layer.

PREFERRED EMBODIMENTS OF THE INVENTION

Next, the present invention will be explained in detail.

In view of the above, the present inventor has made an extensive study. As a result, he has found an organic thin-film transistor and its manufacturing method which provide high mobility of carriers (electrons or holes) and can employ conventional plastics or transparent resins as materials for a support, and completed the invention. The organic thin-film transistor comprises a support and provided thereon, a gate electrode, an insulation layer, a source electrode, a drain electrode, and an organic semiconductor layer, the support comprising at least one of resins, and the organic semiconductor layer containing at least one of organic semiconducting materials, wherein a phase transition temperature of one of the resins is not more than a glass transition point of one of the organic semiconducting materials.

<<Organic Semiconducting Material (Organic Semiconducting Compound)>>

The organic semiconducting compound in the invention will be explained below.

As the organic semiconducting compound, known π-conjugated polymer or oligomer and other organic semiconducting compound as described later are used. The π-conjugated oligomer in the invention implies one having in the molecule a repeating monomer unit number of from 2 to 20 (a polymerization degree of from 2 to 20). The π-conjugated polymer in the invention implies one having a weight average molecular weight of preferably from 1,000 to 500,000, and more preferably from 5,000 to 100,000.

(π-Conjugated Polymers)

Examples of the π-conjugated polymers include polypyrroles such as polypyrrole, poly(N-substituted pyrrole), poly (3-substituted pyrrole), and poly(3,4-disubstituted pyrrole); polythiophenes such as polythiophene, poly(3-substituted thiophene), poly(3,4-disubstituted thiophene), and polybenzothiophene; polyisothianaphthenes such as polyisothianaphthene; polythienylenevinylenes such as polythienylenevinylene; poly(p-phenylenevinylenes) such as poly(p-phenylenevinylene); polyanilines such as polyaniline, poly (N-substituted aniline), poly(3-substituted aniline), and poly (2,3-substituted aniline); polyacetylenes such as polyacetylene; polydiacetylenes such as polydiacetylene; polyazulenes such as polyazulene; polypyrenes such as polypyrene; polycarbazoles such as polycarbazole and poly(N-substituted carbazole), polyselenophenes such as polyselenophene; polyfurans such as polyfuran and polybenzofuran; poly(p-phenylenes) such as poly(p-phenylene); polyindoles such as polyindole; polypyridazines such as polypyridazine; and polysulfides such as polyphenylene sulfide, and polyvinylene sulfide, and a copolymer comprising two or more units of the monomer unit constituting the above polymers.

(π-Conjugated Oligomers)

Examples of the π-conjugated oligomers include oligomers having the same repeating units as the above polymers, for example, thiophene hexamers including α-sexithiophene, α,ω-dihexyl-α-sexithiophene, α,ω-dihexyl-α-quinquethiophene, and α,ω-bis(3-butoxypropyl)-α-sexithiophene.

(Other Organic Semiconducting Compound)

Examples of other organic semiconducting compound include styrylbenzene derivatives; polyacenes such as naphthacene, pentacene, hexacene, heptacene, dibenzopentacene, tertabenzopentacene, pyrene, dibenzopyrene, chrysene, perylene, coronene, terylene, ovalene, quoterylene, and circumanthracene; derivatives (such as triphenodioxazine, triphenodithiazine, hexacene-6,15-quinone) in which some of carbon atoms of polyacenes are substituted with atoms such as N, S, and O or with a functional group such as a carbonyl group; and polycyclic condensation products described in Japanese Patent O.P.I. Publication No. 11-195790. Further, listed are metallophthalocyanines such as copper phthalocyanine, and fluorine-substituted copper phthalocyanines described in Japanese Patent O.P.I. Publication No. 11-251601; tetracarboxylic acid diimides of condensed ring compounds including naphthalene tetracarboxylic acid imides such as naphthalene 1,4,5,8-teracarboxylic acid diimide, N,N'-bis(4-trifluoromethylbenzyl)naphthalene 1,4,5,8-tetracarboxylic acid diimide, N,N'-bis(1H,1H-perfluorooctyl)naphthalene 1,4,5,8-tetracarboxylic acid diimide derivatives, N,N'-bis(1H,1H-perfluorobutyl)naphthalene 1,4,5,8-tetracarboxylic acid diimide derivatives, N,N'-dioctylnaphthalene 1,4,5,8-tetracarboxylic acid diimide derivatives, and naphthalene 2,3,6,7-tetracarboxylic acid diimides, and anthracene tetracarboxylic acid diimides such as anthracene 2,3,6,7-tetracarboxylic acid diimides; fullerenes such as $C_{60}$, $C_{70}$, $C_{76}$, $C_{78}$, and $C_{84}$; carbon nanotubes such as SWNT; and dyes such as merocyanines and hemicyanines. Further, employed as other organic semiconducting compounds may be organic molecular complexes such as a tetrathiafulvalene (TTF)-tetracyanoquinodimethane (TCNQ) complex, a bis-ethylenetetrathiafulvalene (BEDTTTF)-perchloric acid complex, a BEDTTTF-iodine complex, and a TCNQ-iodine complex. Still further, employed may be σ conjugated polymers such as polysilane and polygermane, as well as organic-inorganic composite materials described in Japanese Patent O.P.I. Publication No. 2000-260999.

Of these organic semiconducting compounds, preferably employed is at least one selected from the group consisting of π-conjugate polymers or oligomers, which have thiophene, vinylene, thienylenevinylene, phenylenevinylene, p-phenylene, their substitution product or at least two kinds thereof as a repeating unit, and condensed polycyclic aromatic compounds such as pentacene. Materials are preferred which form a stereo-regular structure by incorporating a substituent such as alkyl having a carbon atom number of from 4 to 15 in at least one portion of the repeating unit. Incorporation of a substituent such as alkyl can increase solubility to an organic solvent of organic semiconducting compounds, and give regularity to a high order structure of the polymer from which organic semiconductor layer is formed.

Of the π-conjugated polymers or oligomers, a homopolymer, a copolymer, a homo-oligomer, or a co-oligomer containing a thiophene ring is preferred, and a homopolymer, a copolymer, a homo-oligomer, or a co-oligomer containing a unit, in which two or more of 3-alkylthiophene rings are regio-regularly connected in series, is more preferred.

(Alkyl Group of 3-alkylthiophene)

A manufacturing method of the organic thin-film transistor (or a manufacturing method of the thin film) of the invention will be described later. The manufacturing method of the organic thin-film transistor, comprising providing a coating solution containing the organic semiconducting material and coating the solution on a support, is preferably used in precisely controlling the thin film formation and improving productivity. In this method, the alkyl group of the 3-alkylthiophene is preferably a straight chained alkyl group having a carbon atom number of from 4 to 15, in increasing solubility of the organic semiconducting material in various solvents used in the coating solution and in forming a coated film so that the thiophene ring in the semiconducting material in the coated film exhibits a specific regio-regularity; and more preferably a straight chained alkyl group having a carbon atom number of not less than 6, and preferably from 8 to 12, in adjusting the phase transition temperature of the organic semiconducting material to liquid crystal phase to not more than 240° C. and in making it possible to used a conventional plastic sheet as the support of the organic thin-film transistor.

Typical examples of poly(3-alkylthiophene) include poly (3-hexylthiophene), poly(3-octylthiophene), poly(3-decylthiophene), and oligo(3-hexylthiophene) (for example, octamer to hexadecamer), each being regioregular, and an oligomer or polymer represented by the following formulae.

-continued

Further, as the polythiophene used in the invention, there are those disclosed in Japanese Patent O.P.I. Publication No. 10-190001, "Nature", 41, p. 685 (1999), or Applied Phys. Lett., 69, p. 4108 (1996).

(Molecular Weight of Polythiophene)

The weight average molecular weight of the thiophene homopolymer or copolymer used in the invention is preferably from 1,000 to 500,000, and more preferably from 5000 to 100,000.

<<Phase Transition Temperature (T° C.) of Organic Semiconducting Material>>

It is necessary that in the organic thin-film transistor of the invention, a phase transition temperature (° C.) of at least one of the organic semiconducting materials used is not more than a glass transition point (° C.) of at least one of resins constituting a support described later in obtaining the effects of the invention that the organic thin-film transistor has a high carrier (electron or hole) mobility and can employ conventional plastic materials or transparent resins as materials for the support.

The term, "a phase transition temperature of organic semiconducting materials", herein referred to implies a melting point, a softening point, a secondary transition temperature (for example, a glass transition point), or a phase transition point to liquid crystal phase. The phase transition temperature (liquid phase transition point) of the organic semiconducting materials used in the invention is preferably from 100 to 240° C.

It is especially preferred that the melting point or liquid phase transition point of the organic semiconducting materials is not more than a glass transition point (° C.) of at least one of resins constituting the support.

The melting point can be measured through an automatic melting point apparatus available on the market, and the phase transition point can be measured through a differential scanning colorimeter (DSC) available on the market. The phase transition behavior can be observed through a polarization microscope (POM). The higher order structure, relationship between crystallinity or liquid crystallinity and the molecular structure can be analyzed through X-ray diffraction (XRD).

<<Forming Method of Organic Semiconductor Layer (Organic Thin-Film)>>

The methods for forming the organic semiconductor layer include a vacuum deposition method, a molecular beam epitaxial growth method, an ion cluster beam method, a low energy ion beam method, an ion plating method, a CVD method, a sputtering method, a plasma polymerization method, an electrolytic polymerization method, a chemical polymerization method, a spray coating method, a spin coating method, a blade coating method, a dip coating method, a casting method, a roll coating method, an bar coating method, a die coating method, an ink-jet method, and an LB method. These methods may be used according to kinds of materials used.

However, of these, the spin coating method, blade coating method, dip coating method, roll coating method, bar coating method, die coating method and ink-jet method are preferred from the viewpoint of productive efficiency, which can simply and accurately form the layer employing a solution of organic semiconductor materials. Further, an organic semiconductor layer may be formed, jetting a solution or dispersion of the organic semiconductor by ink jet and drying.

The organic semiconductor layer, after formed, is preferably subjected to heat treatment. The organic semiconductor layer is heated to not less than the phase transition temperature or preferably not less than the melting point of the organic semiconducting material to transit the phase, and cooled to solidify, whereby an organic semiconductor layer is formed. It is preferred that the cooling is gradually carried out at a cooling speed of not more than 5° C./sec., and preferably from 0.1° C./sec to 1° C./sec. The effect that the carrier mobility of the organic semiconductor layer is increased due to the gradual cooling is obtained. A support having a glass transition point satisfying the conditions described above exhibits the unexpected result that the mobility is further increased.

(Thickness of Organic Semiconductor Layer)

The thickness of the organic semiconductor layer is not specifically limited. The thickness of an organic semiconductor layer comprised of the organic semiconductor materials often has a great influence on properties of the resultant transistor. Accordingly, the thickness of the layer differs due to kinds of the organic semiconductor materials used, but it is preferably not more than 1 μm, and more preferably from 10 to 300 nm.

<<Support>>

The support in the invention will be explained below.

In is necessary to obtain the effect of the invention that in the organic thin-film transistor of the invention, a glass transition point (S° C.) of at least one of resins constituting the support is not less than a phase transition temperature (T° C.) of at least one of the organic semiconducting materials used, i.e., S (° C.)≧T (° C.).

The relationship between the glass transition point of resins and a phase transition temperature of organic semiconducting materials is relative, and therefore, any conventional resins can be used as the resin constituting the support, as long as they satisfy the above formula.

The support is comprised of glass or a flexible resin sheet. For example, it is possible to use a plastic film as the sheet. Examples of materials for the plastic film include polyesters such as polyethylene terephthalate (PET) and polyethylene naphthalate (PEN); polyvinylidene chloride; polyvinyl alcohol; polyethylene vinyl alcohol; syndiotactic polystyrene; polyethylene; polypropylene; cellophane; polyethersulfone (PES); polyetherimide PEI); polyether ether ketone; polysulfone (PSF); polyphenylene sulfide; polyallylate; polyimide; polyamide; polycarbonate (PC); norbornene resin (cyclolefin resin); polymethylpentene; fluorine-contained resin; acryl resin; ellulose esters such as cellulose triacetate (TAC), cellulose diacetate, cellulose acetate propionate (CAP), cellulose acetate butyrate, cellulose acetate phthalate, and cellulose nitrate; and their derivatives.

Of these, polyethersulfone (PES), polyetherimide PEI), polyether ether ketone, polysulfone (PSF), norbornene resin, hest resistant polycarbonate, cellulose triacetate (TAC), cellulose diacetate (DAC), cellulose acetate propionate (CAP), cellulose acetate butyrate, cellulose acetate phthalate, and cellulose nitrate are preferred.

The plastic film can be subjected to surface treatment or surface coating employing a conventional method. A co-deposit layer of silicon oxide and aluminum oxide or a layer or multi-layers of a mixture of metal oxides such as silicon oxide and aluminum oxide according to a plasma method may be provided on the film as a gas barrier layer. A metal film deposited with metal such as aluminum may be laminated on the above plastic film to obtain a composite film. Further, metal oxide particles may be incorporated in the plastic film.

Use of the plastic film makes it possible to decrease weight, to enhance portability, and to enhance durability against impact due to its flexibility, as compared to glass.

The glass transition point of resins constituting the support can be measured through a differential scanning colorimeter (DSC) or a dynamic viscoelasticity meter.

The glass transition point of the resins used in the invention is preferably not less than 110° C., and more preferably not less than 150° C. The glass transition point of the resins used in the invention is preferably not more than 350° C.

<<Orientation Layer (Orientation Film)>>

The orientation layer in the invention will be explained below.

When the organic semiconducting material of the organic semiconductor layer constituting the organic thin-film transistor of the invention exhibits liquid crystal property, an orientation layer is preferably provided adjacent to the organic semiconductor layer, the orientation film having capability of orientating the organic semiconducting material in a specific direction.

As the orientation layer in the invention, conventional ones used in conventional liquid crystal display can be used, which are disclosed in for example, Japanese Patent O.P.I. Publication Nos. 9-194725 and 9-80440. Polyimide, perfluoro polymer or liquid crystal polymer is used as material for the orientation layer, formed orientation layer is preferably subjected to rubbing treatment. Orientation according to an electromagnetic field can be carried out as disclosed in U.S. Pat. No. 5,468,519.

In the invention, a light oriented orientation layer (film) is preferred, and examples thereof include those as disclosed in Japanese Patent O.P.I. Publication Nos. 8-28680, 8-313910, and 9-80440. The thickness of the orientation layer is preferably from 1 nm to 5 μm, and more preferably from 5 nm to 100 nm.

(Additives)

In the invention, the organic semiconductor layer may be subjected to a so-called doping treatment by incorporating in the layer, materials working as an acceptor which accepts electrons, for example, acrylic acid, acetamide, materials having a functional group such as a dimethylamino group, a cyano group, a carboxyl group and a nitro group, benzoquinone derivatives, or tetracyanoethylene, tetracyanoquinodimethane or their derivatives, or materials working as a donor which donates electrons, for example, materials having a functional group such as an amino group, a triphenyl group, an alkyl group, a hydroxyl group, an alkoxy group, and a phenyl group; substituted amines such as phenylenediamine; anthracene, benzoanthracene, substituted benzoanthracenes, pyrene, substituted pyrene, carbazole and its derivatives, and tetrathiafulvalene and its derivatives.

The doping herein means that an electron accepting molecule (acceptor) or an electron donating molecule (donor) is incorporated in the organic semiconductor layer as a dopant. Accordingly, the layer, which has been subjected to doping, is one which comprises the condensed polycyclic aromatic compounds and the dopant. Employed as the dopant used in the present invention may be either acceptor or donor. Examples of the acceptor include halogens such as $Cl_2$, $Br_2$, $I_2$, ICl, $ICl_3$, IBr, and IF; Lewis acids such as $PF_5$, $AsF_5$, $SbF_5$, $BF_3$, $BCl_3$, $BBr_3$, and $SO_3$; protonic acids such as HF, HCl, $HNO_3$, $H_2SO_4$, $HClO_4$, $FSO_3H$, $ClSO_3H$, and $CF_3SO_3H$; organic acids such as acetic acid, formic acid, and amino acid; transition metal compounds such as $FeCl_3$, FeOCl, $TiCl_4$, $ZrCl_4$, $HfCl_4$, $NbF_5$, $NbF_5$, $NbCl_5$, $TaCl_5$, $MoCl_5$, $WF_5$, $WCl_5$, $UF_6$, $LnCl_3$ (Ln=lanthanoid such as La, Ce, Nd, and Pr, and Y), and electrolyte anions such as $Cl^-$, $Br^-$, $I^-$, $ClO^{4-}$, $PF^{6-}$, $AsF^{5-}$, $SbF^{6-}$, $BF^{4-}$, and a sulfonate anion. Examples of the donor include alkali metals such as Li, Na, K, Rb, and Cs; alkaline earth metals such as Ca, Sr, and Ba; rare earth metals such as Y, La, Ce, Pr, Nd, Sm, Eu, Gd, Tb, Dy, Ho, Er, and Yb; an ammonium ion; $R_4P^+$, $R_4AS^+$, and $R_3S^+$; and acetylcholine. Doping these dopants may be carried out employing either a method in which the dopants are incorporated into an organic semiconductor layer having been formed, or a method in which the dopants are incorporated into an organic semiconductor layer while the layer is formed. The former methods include a gas phase doping in which gaseous dopants are employed, a liquid phase doping in which doping is carried out while the layer is brought into contact with a dopant solution or a liquid dopant, and a solid phase doping in which diffusion doping is carried out while the layer is brought into contact with a solid dopant so that the dopant diffuse into the layer. In the liquid phase doping, it is possible to adjust the doping efficiency by means of electrolysis. In the latter method, a solution or a dispersion each containing an organic semiconductor material and a dopant may be coated and subsequently dried. For instance, when a vacuum deposition method is used, dopants may be incorporated in the layer by co-deposition of an organic semiconductor material and a dopant. Further, when the layer is formed employing a sputtering method, sputtering is carried out utilizing the two targets of an organic semiconductor material and a dopant, whereby the dopant can be incorporated in the layer. Still further, as other methods, it is possible to use any of chemical doping such as electrochemical doping or photoinitiation doping, or physical doping such as an ion injection method as shown in, for example, a publication "Kogyo Zairyo", Volume 34, No. 4, page 55 (1986).

<<Electrode>>

A gate electrode, a source electrode and a drain electrode, which are used as electrodes of the organic thin-film transistor of the invention, will be explained below. As materials for the gate electrode, the source electrode and the drain electrode, conventional materials used in the organic thin-film transistor can be employed. Employed as the materials are platinum, gold, silver, nickel, chromium, copper, iron, tin, antimony, lead, tantalum, indium, palladium, tellurium, rhenium, iridium, aluminum, ruthenium, germanium, molybdenum, tungsten, tin oxide-antimony, indium oxide-tin (ITO), fluorine-doped zinc oxide, zinc, carbon, graphite, glassy carbon, silver paste as well as carbon paste, lithium, beryllium, sodium, magnesium, potassium, calcium, scandium, titanium, manganese, zirconium, gallium, niobium, sodium, sodium-potassium alloy, magnesium, lithium, aluminum, magnesium/copper mixtures, magnesium/silver mixtures, magnesium/aluminum mixtures, magnesium/indium mixtures, aluminum/aluminum oxide mixtures, and lithium/aluminum mixtures. Of theses, specifically preferred are platinum, gold, silver, copper, aluminum, indium, and ITO. Electrically conductive polymers known in the art are suitably employed, which include electrically conductive polyaniline, electrically conductive polypyrrole, electrically conductive polythiophene, and a complex of polyethylenedioxythiophene and polystyrene sulfonic acid, which increase electrical conductivity upon being doped. Materials for the source and drain electrodes are preferably those which provide a low electric resistance at the electrode surface contacting the organic semi-conductor layer.

Methods for forming the electrode include a method in which a photolithographic method or a lift-off method, known in the art, is applied to an electrically conductive layer of the materials described above, which has been formed employing a vacuum deposition method or a sputtering method, and a method in which a resist layer is subjected to etching which has been prepared employing thermal transfer or ink jet printing onto a foil of metal such as aluminum or copper. Further, an electrically conductive polymer solution or dispersion, or a minute electrically conductive particle dispersion may be subjected directly to patterning, employing ink jet printing to obtain an electrode. An electrode may also be formed in such a manner that a coated layer is subjected to lithography or laser ablation. In addition, a method may also be employed in which ink comprising either an electrically conductive polymer or minute electrically conductive particles, or electrically conductive paste is subjected to patterning, employing any of the printing methods such as letter press, intaglio printing, lithography, or screen printing. When a TFT sheet is prepared, a source busline, a gate busline, and a display electrode are provided, and as materials or formation thereof, those described above apply.

As particles for the conductive particles above, particles of metal, inorganic oxides, inorganic nitrides or polymers are used, and metals particles are preferably used. Examples of the metal for metal particles include platinum, gold, silver, nickel, chromium, copper, iron, tin, antimony, lead, tantalum, indium, palladium, tellurium, rhenium, iridium, aluminum, ruthenium, germanium, molybdenum, tungsten, and zinc. The metals are preferably platinum, gold, silver, copper, cobalt, chromium, iridium, nickel, palladium, molybdenum, and tungsten, each of which has a work function of not less than 4.5 eV.

Methods for preparing such metal particle dispersions include a physical preparation method such as a gas vaporization method, a sputtering method, or a metallic vapor preparation method and a chemical preparation method such as a colloid method or a co-precipitation method in which metal ions are reduced in a liquid phase to produce metal particles. The metal particle dispersions are preferably ones prepared according to a colloid method disclosed in Japanese Patent O.P.I. Publication Nos. 11-76800, 11-80647, 11-319538, and 2000-239853, or ones prepared according to a gas vaporization method disclosed in Japanese Patent O.P.I. Publication Nos. 2001-254185, 2001-53028, 2001-35255, 2001-124157 and 2000-123634.

<<Insulation Layer (Gate Insulation Layer)>>

Next, an insulation layer (gate insulation layer) used in the invention will be explained. Various insulating materials layer may be employed in the gate insulation layer. The insulation layer is preferably an inorganic oxide layer comprised of an inorganic oxide with high dielectric constant. Examples of the inorganic oxide include silicon oxide, aluminum oxide, tantalum oxide, titanium oxide, tin oxide, vanadium oxide, barium strontium titanate, barium zirconate titanate, zirconic acid lead carbonate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Of these, silicon oxide, silicon nitride, aluminum oxide, tantalum oxide or titanium oxide is particularly preferred. An inorganic nitride such as silicon nitride or aluminum nitride can be also suitably used.

The methods for forming the inorganic oxide layer include a dry process such as a vacuum deposition method, a molecular beam epitaxial growth method, an ion cluster beam method, a low energy ion beam method, an ion plating method, a CVD method, a sputtering method, or an atmospheric pressure plasma method, a wet process such as a spray coating method, a spin coating method, a blade coating method, a dip coating method, a casting method, a roll coating method, an bar coating method, or a die coating method, and a patterning method such as a printing method or an ink-jet method. These methods can be used due to kinds of materials used in the insulation layer. As the typical wet process can be used a method of coating a dispersion liquid and drying, the liquid being obtained by dispersing inorganic oxide particles in an organic solvent or water optionally in the presence of a dispersant such as a surfactant, or a so-called sol gel method of coating a solution of an oxide precursor such as an alkoxide and drying. Among the above, the preferred are an atmospheric pressure plasma method and a sol gel method.

A method of forming an insulation layer according to the atmospheric pressure plasma method will be explained below.

The atmospheric pressure plasma method means a method wherein a reactive gas is plasma-excited by discharge conducted at atmospheric pressure or at approximately atmospheric pressure, whereby a thin-film is formed on a substrate. The method (hereinafter referred to also as an atmospheric pressure plasma method) is described in Japanese Patent O.P.I. Publication Nos. 11-133205, 2000-185362, 11-61406, 2000-147209 and 2000-121804. This method can form a thin film having high performance at high productivity.

Examples of the organic compound used in an organic compound layer include polyimide, polyamide, polyester, polyacrylate, a photo-curable resin such as a photo-radical polymerizable or photo-cation polymerizable resin, a copolymer containing an acrylonitrile unit, polyvinyl phenol, polyvinyl alcohol, novolak resin, cyanoethylpullulan, and phosphazene compounds containing a polymer or an elastomer.

As a method of forming the organic compound layer, the wet process described above is preferably used.

An inorganic oxide layer and an organic oxide layer can be used in combination and superposed. The thickness of the insulation layer is generally 50 nm to 3 μm, and preferably 100 nm to 1 μm. The insulation layer can be surface treated with known silane coupling agents.

<<Constitution of the Organic Thin-Film Transistor of the Invention>>

The organic thin-film transistor of the invention will be explained below, employing FIGS. 1(a) through 1(f). FIGS. 1(a) through 1(f) show sectional views of the constitution of the organic thin-film transistor of the invention.

Figure 1:
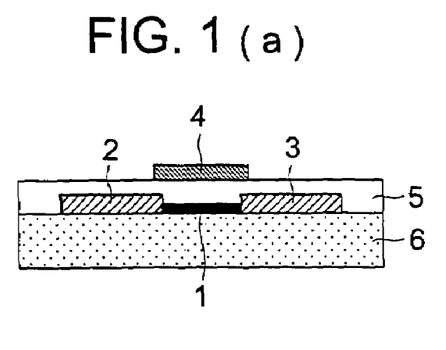
FIGS. 1(a) through 1(f) show sectional views of embodiments of the organic thin-film transistor of the invention.

FIG. 1(a) shows a sectional view of an organic thin-film transistor which is obtained by forming source electrode 2 and drain electrode 3, each being comprised of a metal foil, on support 6, forming organic semiconductor layer 1 between the electrodes, forming insulation layer 5 on the resulting layer, and then forming gate electrode 4 on the insulation layer.

FIG. 1(b) shows a sectional view of an organic thin-film transistor which is obtained by forming organic semiconductor layer 1 in the same manner as in FIG. 1(a), except that organic semiconductor layer 1 is formed according to a coating method so as to cover source electrode 2, drain electrode 3, and support 6.

FIG. 1(c) shows a sectional view of an organic thin-film transistor which is obtained by forming organic semiconductor layer 1 on support 6 according to a coating method, and then forming source electrode 2, drain electrode 3, insulation layer 5 and gate electrode 4 in that order on the organic semiconductor layer.

FIG. 1(d) shows a sectional view of an organic thin-film transistor which is obtained by forming gate electrode 4 comprised of a metal foil on support 6, forming insulation layer 5 on the gate electrodes 4 and support 6, forming source electrode 2 and drain electrode 3, each being comprised of a metal foil, on the insulation layer, and then forming organic semiconductor layer 1 comprising an organic semiconducting compound between the source and drain electrodes.

FIG. 1(e) shows a sectional view of an organic thin-film transistor which is obtained by forming organic semiconductor layer 1 in the same manner as in FIG. 1(d), except that organic semiconductor layer 1 is formed so as to cover source electrode 2, drain electrode 3, and insulation layer 5.

FIG. 1(f) shows a sectional view of an organic thin-film transistor which is obtained by forming gate electrode 4 on support 6, forming insulation layer 5 on the gate electrode 4 and support 6, forming organic semiconductor layer 1 on the insulation layer 5, and then forming source electrode 2 and drain electrode 3 on the organic semiconductor layer.

EXAMPLES

The present invention will be explained below employing examples, but is not limited thereto.

Example 1

Organic thin-film transistor samples 1 through 11 were prepared as described below.

<<Preparation of an Organic Thin-Film Transistor Sample 1>>

The organic thin-film transistor sample 1 was prepared according to the following procedures.

A 300 nm thick and 300 μm wide aluminum layer as a gate electrode was formed on a 100 μm thick PES film (FS-1300, produced by Sumitomo Bakelite Co., Ltd.) as a support according to a sputtering method. The glass transition temperature of the PES film-measured by means of DSC was 228° C.

The resulting film was subjected to anodizing treatment in an aqueous 30% by weight sulfuric acid solution in which direct electric current was supplied from a 30V low voltage power source for 2 minutes to form an anodization film with a thickness of 120 nm, subjected to vapor sealing treatment in a vapor saturated chamber at one atmosphere and at 100° C., and coated with a solution of polyimide 5221 (produced by Nissan Kagaku Co., Ltd.) employing an applicator to form a 50 nm thick polyimide layer.

The polyimide layer was rubbed with a piece of cloth in a direction perpendicular to the transverse direction to orient, and vacuum deposited with gold employing a mask to form a 100 nm thick and 100 pm wide drain electrode and a 100 nm thick and 100 pm wide source electrode. The drain and source electrodes were provided perpendicular to the gate electrode.

A chloroform solution of regioregular substance of poly(3-octylthiophene) (produced by Rieke Metals Inc.), which was purified so that the content of Zn and Ni was not more than 10 ppm, was prepared. The melting point of the regioregular substance measured by means of DSC was 187° C. The resulting solution was ejected between the source and drain electrodes in an nitrogen atmosphere employing a piezo-type ink jet recording head, dried at room temperature, and further heat treated at 50° C. for 30 minutes. The thickness of the resulting poly(3-octylthiophene) layer at channel portions was 50 nm. Thus, an organic thin-film transistor sample 1 was obtained which had a channel with a channel length (L) of 20 μm and a channel width (W) of 0.3 mm. The organic thin-film transistor, sample 1 exhibited a good p-channel FET property. Mobility, which was computed from a saturation region of I-V characteristic according to a conventional method, was $2 \times 10^{-3}$ cm$^2$/V·s.

<<Preparation of an Organic Thin-Film Transistor Sample 2>>

The organic thin-film transistor sample 1 was heated to a melting point of the poly(3-octylthiophene) in an nitrogen atmosphere to melt the poly(3-octylthiophene), and then cooled to room temperature at a rate of −1° C./second. Heat treatment in Table 1 described later refers to this heat treatment. Thus, an organic thin-film transistor sample 2 was obtained. The organic thin-film transistor sample 2 exhibited a good p-channel FET property. Mobility of sample 2 was $1\times10^{-2}$ cm$^2$/V·s.

<<Preparation of an Organic Thin-Film Transistor Sample 3>>

Organic thin-film transistor sample 3 was prepared in the same manner as in organic thin-film transistor sample 2, except that a 100 μm thick polyetherimide (PEI) film (FS-1400, produced by Sumitomo Bakelite Co., Ltd.) was used as the support. The glass transition temperature of the PEI film measured by means of DSC was 219° C.

<<Preparation of Organic Thin-Film Transistor Samples 4 and 5>>

Organic thin-film transistor sample 4 was prepared in the same manner as in organic thin-film transistor sample 2, except that a cellulose diacetate (DAC) film with a glass transition temperature of 200° C.) available on the market was used as the support.

Organic thin-film transistor sample 5 was prepared in the same manner as in organic thin-film transistor sample 2, except that a polysulfone (PSF) film (FS-1200, produced by Sumitomo Bakelite Co., Ltd.) with a glass transition temperature of 190° C.) available on the market was used as the support. Mobility of the samples was computed in the same manner as in organic thin-film transistor sample 1.

<<Preparation of Organic Thin-Film Transistor Sample 6>>

Organic thin-film transistor sample 6 was prepared in the same manner as in organic thin-film transistor sample 2, except that ARTON (produced by JSR Co., Ltd) with a glass transition temperature of 171° C.) available on the market was used as the support. Mobility of the resulting sample was computed in the same manner as in organic thin-film transistor sample 1.

<<Preparation of Organic Thin-Film Transistor Samples 7, 8 and 9>>

Organic thin-film transistor sample 7 was prepared in the same manner as in organic thin-film transistor sample 2, except that a regioregular substance of poly(3-decylthiophene) (produced by Rieke Metals Inc.) was used instead of poly(3-octylthiophene) as the semi-conducting material, and a PES (polyethersulfone) film available on the market was used as the support. Organic thin-film transistor sample 8 was prepared in the same manner as in organic thin-film transistor sample 2, except that a regioregular substance of poly(3-decylthiophene) (produced by Rieke Metals Inc.) was used instead of poly(3-octylthiophene) as the semi-conducting material and a DAC (diacetylcellulose) film available on the market was used as the support. Organic thin-film transistor sample 9 was prepared in the same manner as in organic thin-film transistor sample 2, except that a regioregular substance of poly(3-decylthiophene) (produced by Rieke Metals Inc.) was used instead of poly(3-octylthiophene) as the semi-conducting material, and a PEN (polyethylene naphthalate) film available on the market was used as the support.

Mobility of the resulting samples 7, 8 and 9 was computed in the same manner as in organic thin-film transistor sample 1.

<<Preparation of Organic Thin-Film Transistor Samples 10 and 11>>

Organic thin-film transistor sample 10 was prepared in the same manner as in organic thin-film transistor sample 2, except that a regioregular substance of poly(3-hexylthiophene) (produced by Rieke Metals Inc.) was used instead of poly(3-octylthiophene) as the semi-conducting material, and a PES film available on the market was used as the support. Organic thin-film transistor sample 11 was prepared in the same manner as in organic thin-film transistor sample 2, except that a regioregular substance of poly(3-hexylthiophene) (produced by Rieke Metals Inc.) was used instead of poly(3-octylthiophene) as the semi-conducting material, and a PEI (polyetherimide) film available on the market was used as the support.

Mobility of the resulting samples 10 and 11 was computed in the same manner as in organic thin-film transistor sample 1. The results are shown in Table 1.

TABLE 1

| Organic thin-film transistor sample No. | Organic semi-conducting material | Melting point (° C.) | Support | Glass transition temperature (° C.) | Heat treatment | Mobility cm$^2$/V · s | Remarks |
|---|---|---|---|---|---|---|---|
| 1 | (A) | 187 | PES | 228 | No | $2 \times 10^{-3}$ | Inv. |
| 2 | (A) | 187 | PES | 228 | YES | $1 \times 10^{-2}$ | Inv. |
| 3 | (A) | 187 | PEI | 219 | YES | $1 \times 10^{-2}$ | Inv. |
| 4 | (A) | 187 | DAC | 200 | YES | $8 \times 10^{-3}$ | Inv. |
| 5 | (A) | 187 | PSF | 190 | YES | $3 \times 10^{-3}$ | Inv. |
| 6 | (A) | 187 | ARTON | 171 | YES | $1 \times 10^{-4}$ | Comp. |
| 7 | (B) | 147 | PES | 228 | YES | $1 \times 10^{-3}$ | Inv. |
| 8 | (B) | 147 | DAC | 200 | YES | $1 \times 10^{-3}$ | Inv. |
| 9 | (B) | 147 | PEN | 130 | YES | $1 \times 10^{-5}$ | Comp. |
| 10 | (C) | 225 | PES | 228 | YES | $5 \times 10^{-3}$ | Inv. |
| 11 | (C) | 225 | PEI | 216 | YES | $2 \times 10^{-4}$ | Comp. |

Inv.: Inventive, Comp.: Comparative
(A): Poly(3-octylthiophene)
(B): Poly(3-decylthiophene)
(C): Poly(3-hexylthiophene)

As is apparent from Table 1, the inventive organic thin-film transistor samples provide a greater mobility as compared with the comparative organic thin-film transistor samples.

EFFECT OF THE INVENTION

The present invention can provide an organic thin film transistor with a high mobility of carriers which is capable of employing a sheet of conventional plastics or transparent resins as a support, and a manufacturing method thereof.

What is claimed is:

1. A manufacturing process of an organic thin-film transistor comprising a support and provided thereon, a gate electrode, an insulation layer, a source electrode, a drain electrode, and an organic semiconductor layer, the support comprising at least one of resins, and the organic semiconductor layer containing at least one of organic semiconducting materials, wherein a phase transition temperature of one of the organic semiconducting materials is not more than a glass transition point of one of the resins, the process comprising the steps of:

providing a solution or dispersion solution of the organic semiconducting material;

coating the solution or dispersion solution on the support or on the insulation layer to form an organic semiconductor layer;

heat treating the resulting organic semiconductor layer; and cooling the heat treated organic semiconductor layer at a cooling speed of not more than 5° C./sec.

2. The manufacturing process of claim 1, comprising the step of heat treating the organic semiconductor layer at a heating temperature between the phase transition temperature and the glass transition point.

3. The manufacturing process of claim 2, wherein the heating temperature is in the range of from 100 to 250° C.

4. The manufacturing process of claim 2, wherein the phase transition temperature is in the range of from 100 to 240° C.

5. The manufacturing process of claim 2, wherein the glass transition temperature is in the range of from 110 to 250° C.

6. The manufacturing process of claim 1, wherein one of the organic semiconducting materials is a n-conjugated polymer or oligomer.

7. The manufacturing process of claim 6, wherein the n-conjugated polymer is a homopolymer or copolymer of thiophene and the n-conjugated oligomer is a homo-oligomer or co-oligomer of thiophene.

8. The manufacturing process of claim 7, wherein the homopolymer or copolymer of thiophene is a homopolymer or copolymer containing a unit with two or more 3-alkylthiophene rings regioregularly connected in series, and the homo-oligomer or co-oligomer of thiophene is a homo-oligomer or co-oligomer containing a unit with two or more 3-alkylthiophene rings regioregularly connected in series.

9. The manufacturing process of claim 8, wherein the alkyl group of the 3-alkylthiophene rings is an alkyl group having a carbon atom number of from 4 to 15.

* * * * *